United States Patent
Shirakawa

(10) Patent No.: US 8,459,045 B2
(45) Date of Patent: Jun. 11, 2013

(54) HELIUM-3 REFRIGERATING MACHINE-USING MAGNETIZATION MEASURING SYSTEM

(75) Inventor: Naoki Shirakawa, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 1099 days.

(21) Appl. No.: 10/587,375

(22) PCT Filed: Jan. 24, 2005

(86) PCT No.: PCT/JP2005/000846
§ 371 (c)(1),
(2), (4) Date: Jan. 9, 2007

(87) PCT Pub. No.: WO2005/071766
PCT Pub. Date: Aug. 4, 2005

(65) Prior Publication Data
US 2008/0229761 A1    Sep. 25, 2008

(30) Foreign Application Priority Data
Jan. 26, 2004  (JP) .................................. 2004-016486

(51) Int. Cl.
*F25B 19/00* (2006.01)
*G01R 33/02* (2006.01)

(52) U.S. Cl.
USPC .......................................... 62/51.1; 324/248

(58) Field of Classification Search
USPC ................ 62/49.1, 51.1; 324/724, 631, 248, 324/244
See application file for complete search history.

(56) References Cited

U.S. PATENT DOCUMENTS

| | | | | | |
|---|---|---|---|---|---|
| 2,900,237 | A | * | 8/1959 | Davidson | 422/244 |
| 4,613,816 | A | * | 9/1986 | Zeamer | 324/248 |
| 5,119,637 | A | * | 6/1992 | Bard et al. | 62/51.2 |
| 5,150,812 | A | * | 9/1992 | Adams | 220/589 |
| 2003/0122543 | A1 | | 7/2003 | Shirakawa et al. | |

FOREIGN PATENT DOCUMENTS

| | | |
|---|---|---|
| JP | 8-321416 | 12/1996 |
| JP | 08-321416 | 12/1996 |
| JP | 2002-248325 | 9/2002 |
| JP | 2004-87899 | 3/2004 |
| WO | WO 2004079340 A2 * | 9/2004 |

* cited by examiner

*Primary Examiner* — John Pettitt
(74) *Attorney, Agent, or Firm* — Oblon, Spivak, McClelland, Maier & Neustadt, L.L.P.

(57) ABSTRACT

In a helium 3 refrigerator-utilizing magnetic property measurement system (MPMS) which enables magnetization measurement to be effected until 0.3 K, a main pipe, to enable magnetization measurement to be infallibly effected even when the upper limit of a magnetic field the MPMS can induce is applied, includes an upper supporting tube positioned in the uppermost part and allowing a bellows to be connected to the lateral part thereof, a condensing tube supported in the lower part of the upper supporting tube, an outer tube fixed in the lower part of the condensing tube and adapted to form an outer wall of an insulated vacuum chamber, and a lower inner tube forming an inner wall of the insulated vacuum chamber. In each of the tubes, the lower inner tube is formed of titanium. As a result, a background signal can be decreased and the measurement can be infallibly effected until the upper limit of the magnetic field of the MPMS.

6 Claims, 2 Drawing Sheets

HELIUM-3 REFRIGERATING MACHINE-USING MAGNETIZATION MEASURING SYSTEM

TECHNICAL FIELD

This invention relates to a magnetic property measurement system necessary for the purpose of studying physical properties of various kinds of substances at very low temperatures and particularly, in a helium 3 refrigerator-utilizing magnetic property measurement system adapted to generate a very low temperature reaching 0.3 K and effect an easy magnetic property measurement at the user's disposal by utilizing an MPMS that has been heretofore capable of generating a low temperature of about 1.8 K by the use of helium 4, further using helium 3, and adding a simple device thereto as well, relates to a helium 3 refrigerator-utilizing magnetic property measurement system which is enabled to obtain an expected low temperature infallibly and acquire an accurate temperature signal while decreasing a background signal.

BACKGROUND ART

The magnetic property measurement is an indispensable means in the study of the physical properties of magnetic materials and superconducting materials. As regards this magnetic property measurement, the machine made by Quantum Design Corp. of the US and called MPMS (Magnetic Property Measurement System) is in fact monopolizing the market as a standard measurement system. This system has two distinctive features, i.e. the realization of high sensitivity owing to the use of a Superconducting QUantum Interference Device (SQUID) and the automatic acquisition of data owing to the perfect automation of measurement.

Since the lower limit of the measurement temperature of this system, however, falls no further than 1.8 K that is a magnitude attained by pumping on liquid helium 4, the system has been unusable for the study of Ru-based and Re-based superconducting oxides, various heavy-electron type superconducting materials, organic magnetic materials and molecular magnetic materials which have lower transition temperatures than this lower limit.

In the invention of JP-A 2002-248325 ("magnetic property measurement system utilizing a helium 3 refrigerator"), a means that is enabled by the refrigerating effect utilizing liquid helium 3 to produce in the specimen chamber of the MPMS a space cooled till 0.3 K and permit magnetic property measurement at temperatures ranging from 0.3 K to 1.8 K is revealed.

Specifically, FIG. 2 is a diagram schematically illustrating the structure of a helium 3 refrigerator-utilizing magnetic property measurement system formerly proposed by the present inventor and depicting the software configuration of a controlling device for the magnetic property measurement system as well. As the basic structure of the helium 3 refrigerator-utilizing magnetic property measurement system shown in this diagram, a magnetic property measurement system 1 utilizing a main structural component of the system heretofore widely used under the name of MPMS as described above is used. In this system, a liquid helium container 2 disposed therein allows such a helium 3 refrigerator 20 as will be specifically described herein below to be mounted thereon via an opening formed in the upper part thereof and this helium 3 refrigerator 20 allows insertion therein of a sample rod 5 in a similar manner to that heretofore used for the EMS.

The basic function as a measuring device of this magnetic property measurement system 1 consists in enabling a micro-magnetic field generated by a magnetic sample fixed to the sample rod 5 to be detected with a SQUID that makes use of the Josephson effect of a superconducting junction and consequently enabling measurement of the magnetic susceptibility and magnetization curve of a magnetic material and the Meissner effect of a superconducting material sample.

The more specific structures of the magnetic property measurement system 1, the helium 3 refrigerator 20, etc. mentioned above are described in detail in the specification of the former patent application and will be omitted herein. In outline, a cylindrical outer tube 6 is suspended into the liquid helium container 2 holding a liquid helium 4 via an upper opening thereof and is provided on the lower end face thereof with a slender tube 7 extended and opened into the liquid helium 4 stored in the liquid helium container 2.

This outer tube 6 is extended outwardly above the liquid helium container 2, provided on the lateral part thereof with a pump-connecting opening 19, and adapted to connect to the pump-connecting opening 19 via a pipe 10 a main pump 9 of the sort commonly provided for the conventional MPMS. Further, in this system, an auxiliary pump 11 is connected to the pipe 10 as illustrated in FIG. 2. As described herein below, the system enables the interior of a sample chamber 12 to be brought to a still lower temperature by operating this auxiliary pump 11 in addition to operating the main pump 9.

The outer tube 6 is provided on the inner side thereof with a cylindrical sample chamber inner tube 8 that has formed in the upper terminal part thereof an opening for mounting a sample. Directly below the opening, there exists a valve for shutting a measuring space off the atmosphere, a drive mechanism 33 adapted to catch the partly bulged part of the sample rod and move the sample rod vertically, and other necessary parts. Further, the opening for mounting the sample is adapted to form tightly sealed connection to a lower terminal opening 17 of a box 16 through a seal member 18 such as an O-ring compression fitting that excels in sealing performance.

The sample rod 5 which has fixed in the lower part thereof a plurality of measuring members 21 including a sample piece, a heater and a temperature sensor is enabled by opening a lid 36 of the helium 3 refrigerator 20 to be inserted into a main pipe 23 via an opening 24 formed for mounting the sample rod in the upper terminal part of the main pipe 23 and mounted therein. Incidentally, when the sample rod 5 has been inserted into the main pipe 23 as described above, it can be thoroughly sealed with the seal member like an O-ring face seal that is disposed in the opening 24 part for mounting the sample rod. In the illustrated example, the main pipe 23 is provided on the lower periphery thereof with an insulated vacuum member so as to insulate the interior of the main pipe 23 from the space of the sample chamber 12 existing on the external side thereof.

The helium 3 refrigerator 20 uses a bellows 28 to interconnect the opening formed in the upper lateral wall of the main pipe 23 and the opening in the lateral wall of the box 16 and uses a helium 3 gas handling system 30 to first evacuate air in the main pipe 23, introduce helium 3 into the main pipe 23 and pump on the liquefied helium 3. Incidentally, the helium 3 gas handling system 30 and the opening 27 are interconnected with a pipe 31 and the pipe 31 is provided with a valve 32 halfway along the length thereof.

In the system that is provided with the helium 3 gas handling system 30 as described above, the detection by the SQUID is effected by rendering the main pipe 23 movable relative to the box 16, and consequently enabling the main pipe 23 to be vertically moved by a moving device 33 relative to the box 16 fixed on the outer tube 6 of the magnetic property measurement system 1, thereby moving the sample through the pickup coil wound on the outer periphery of the outer tube 6 to generate a current proportional to the magnetic moment of the sample.

A signal wire 34 is extended inwardly from a lateral wall 26 of the box 16 and, when the sample rod 5 is inserted into the main pipe 23, joined to a connector that is disposed in the upper terminal part of the sample rod 5. As a result, the signal wire 34 makes it possible to transfer signals with a control device 40 for use in the magnetic property measurement system as illustrated in FIG. 2. Incidentally, the magnetic property measurement system 1 is also enabled to form connection to the control device 40 of the magnetic property measurement system with the object of effecting control of magnetic field and control of temperature in the interior thereof.

The control device 40 for the magnetic property measurement system, as illustrated in FIG. 2, can be operated by using the MV (MultiView) software 41 already existing heretofore as a unit of software for controlling the magnetic property measurement system 1. In this invention, a software 42 indicated as I-Helium 3 in the diagram is used additionally for the purpose of measuring magnetization of helium 3 in a temperature range of 0.3 to 2 K by the use of the sample refrigerator 20.

By this i-Helium 3 software 42, the transfer of input and output with the temperature sensor and heater on the sample rod 5 can be individually and directly carried out. Further, for the purpose of enabling this magnetic property measurement system to perform a prescribed operation, the operator thereof is enabled to feed in advance the system with a measuring-sequence input 43 as a set of commands to take full control of measurement. As a result, the command of the i-Helium 3 software during the course of the measurement causes the MV software 41 to function through the HSP software 47, widely used for external control of applications and consequently enables the capability of the MV software 41 to control the magnetic field in the magnetic property measurement system 1, and process the input signal of the measurement to calculate the magnetization of the sample.

In the system of such a configuration as described above, after the main pipe 23 has been evacuated to a high vacuum with the helium 3 gas handling system 30 through the opened valve 32, the main pump 9 is actuated by dint of the function of the MV software 41 that is a control software for the MPMs in the control device 40 for the magnetic property measurement system, in order to cool the sample space 12 to 1.8 K. Here, the temperature of the sample space can be further lowered to about 1.5 K by additionally putting the auxiliary pump 11 formed as of a rotary-vane pump to operation.

In the resultant state, when the helium 3 gas ($^3$He gas) is introduced into the main pipe 23 via a liquid nitrogen trap by the operation of the helium 3 gas handling system 30, the helium 3 gas is liquefied and retained in the lower part of the main pipe 23. After the liquefied helium 3 gas so retained has totaled to a prescribed amount, the environment of the sample attached onto the lower terminal part of the sample rod 5 is enabled to be maintained at a low temperature of 0.3 K by evacuating the helium 3 gas from the main pipe 23 with a closed evacuating system by the operation of the helium 3 gas handling system 30. Thereafter, the operator is enabled to utilize the system for acquiring data by dint of the function of the measurement software of the MPMS while controlling the temperature of the sample and the magnetic field as occasion demands.

Patent Document 1: JP-A 2004-087899

DISCLOSURE OF THE INVENTION

Problems the Invention Intends to Solve

Though the patent application mentioned above discloses nothing about the material that forms the helium 3 refrigerator, the material of the main pipe of the refrigerator is required to have small heat conductivity. When stainless steel (hereinafter referred to as "s.s.") commonly used as a material of low heat conductivity for the refrigerator of this kind is adopted, it is destined to induce background that is unwanted for the measurement of magnetization (the signal which stems from anything other than the sample, i.e. in this case, from the material of the main pipe).

As a result, when the applied magnetic field is raised typically above 10 gausses, the measurement entails difficulty because the background grows excessively large and the signal from the sample becomes practically invisible.

Besides this fact, the background manifests hysteresis against the magnetic field because the s.s., though regarded as a nonmagnetic substance, actually exhibits a slightly ferromagnetic behavior. Once the magnetic field has been raised to a high level, there ensues a phenomenon that the background does not appreciably decrease even in the absence of the field and the background inevitably remains at the raised level. When an effort is made to attain deduction of the background by measuring solely the background in advance in the absence of a sample, then repeating the measurement in the presence of a sample, and finding the difference between the results of the two measurements, the presence of hysteresis in the background renders this deduction extremely difficult to accomplish.

The MPMS comes in such models as are provided with superconducting magnets of 1, 5, 7 T. For the reason adduced above, however, these models have been unable to raise their magnetic fields to the limits of their own when a helium 3 refrigerator is utilized.

This invention, therefore, has been based on the present state of affairs and is aimed at providing, in a helium 3 refrigerator-utilizing magnetic property measurement system formerly proposed to realize magnetization measurement till 0.3 K by the use of a commercially available magnetic property measurement system (MPMS), a helium 3 refrigerator-utilizing magnetic property measurement system which enables magnetization measurement even when the magnetic field is applied to the upper limit the MPMS can induce and permits the magnetization measurement to be infallibly carried out to 0.3 K.

Means for Solving the Problems

For the purpose of solving the above problems, the helium 3 refrigerator-utilizing magnetic property measurement system according to this invention comprises a helium 3 refrigerator provided with a sample rod having a sample fixed thereon and a main pipe having the sample rod inserted therein and forming in a circumference of the sample rod a space for effecting cooling with helium 3; and a magnetic property measurement system (MPMS) provided with a tubular body for permitting insertion of the helium 3 refrigerator therein and a cooling means disposed on an outer periphery of the tubular body and operated with helium 4 and further provided with a superconducting magnet, a magnetic field forming means, a temperature adjusting means and a magnetic field adjusting means, wherein the main pipe is formed, as recognized sequentially from top to bottom, of an upper supporting tube, a condensing tube, a lower inner tube and an outer tube to form an insulated vacuum chamber between itself and the lower inner tube and wherein the lower inner tube is formed of titanium.

In the helium 3 refrigerator-utilizing magnetic property measurement system according to this invention, the outer tube is formed of copper.

In the helium 3 refrigerator-utilizing magnetic property measurement system according to this invention, the condensing tube is formed of copper.

In the helium 3 refrigerator-utilizing magnetic property measurement system according to this invention, the upper supporting tube is formed of s.s.

Effects of the Invention

Since this invention contemplates such a configuration as described above, it is at an advantage in enabling magnetization measurement to be effected infallibly till 0.3 K by utilizing a commercially available magnetic property measurement system (MPMS) even when the sample is used in a very minute amount or the sample possesses only weak magnetism.

EXPLANATION OF REFERENCE NUMERALS

Figure 1:
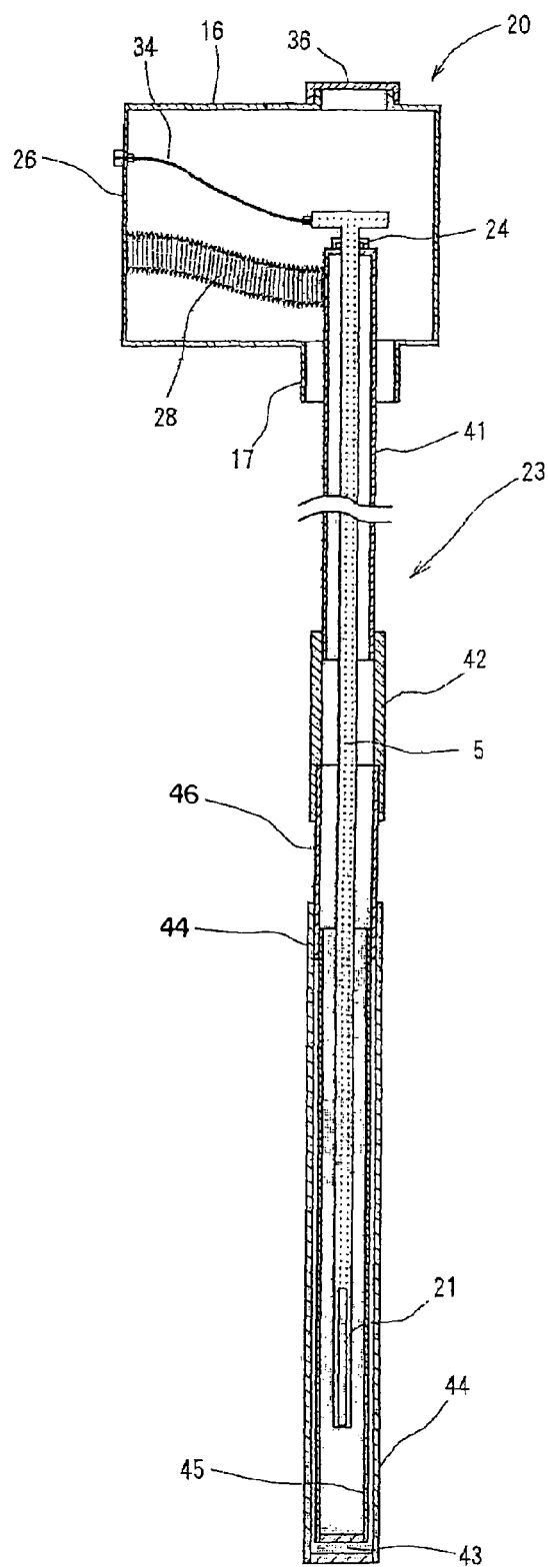
FIG. 1 is a cross section of an example of this invention.
Figure 2:
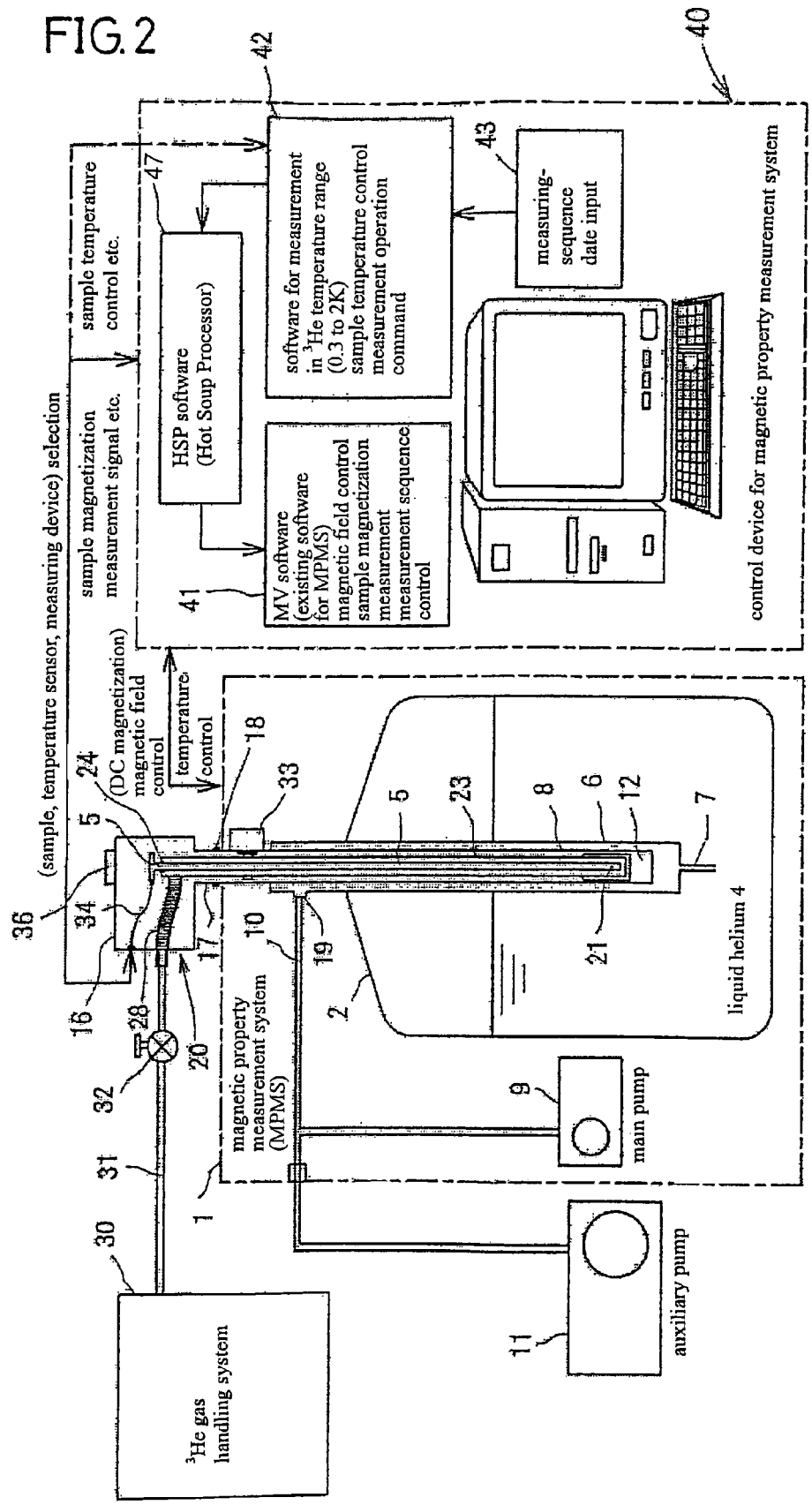
FIG. 2 is a diagram schematically illustrating a helium 3 refrigerator-utilizing magnetic property measurement system formerly proposed by the present inventor and embodying the present invention.

5 Sample rod
16 Box
20 Helium 3 refrigerator
21 Temperature measuring member
23 Main pipe
28 Bellows
41 Upper supporting tube
42 Condensing tube
43 Insulated vacuum chamber
44 Outer tube
45 Lower inner tube
46 Connecting tube

BEST MODE FOR CARRYING OUT THE INVENTION

This invention, with the object of infallibly realizing magnetization measurement till 0.3 K by utilizing a commercially available magnetic property measurement system (MPMS), provides a helium 3 refrigerator-utilizing magnetic property measurement system which is provided with a helium 3 refrigerator equipped with a sample rod having a sample fixed thereon and a main pipe having the sample rod inserted therein and forming in the circumference of the sample rod a space for effecting cooling with helium 3 and a magnetic property measurement system (MPMS) equipped with a tubular body for permitting insertion of the helium 3 refrigerator therein and a cooling means disposed on the outer periphery of the tubular body and operated with helium 4 and further equipped with a superconducting magnet, a magnetic field forming means, a temperature adjusting means and a magnetic field adjusting means, wherein the main pipe is formed, as recognized sequentially from top to bottom, of an upper supporting tube, a condensing tube, a lower inner tube and an outer tube to form an insulated vacuum chamber between itself and the lower inner tube and wherein the lower inner tube is formed of titanium.

Example 1

In the system formerly proposed by the present inventor as described above, the main pipe 23 is particularly composed broadly of four members. It is formed of the upper supporting tube 41 positioned in the uppermost part farthest from a sample given for measurement and allowing connection of the bellows 28 to the lateral part thereof, the condensing tube 42 supported fast in the lower part of the upper supporting tube 41 and adapted to perform a condensing action at 1.6 K infallibly as described herein below, the outer tube 44 fixed in the lower part of the condensing tube 42 via the connecting tube 46 and adapted to form an outer wall of the insulated vacuum chamber 43 which is formed below the condensing tube 42, and the lower inner tube 45 forming the inner wall of the insulated vacuum chamber 43. The outer tube 44 and the lower inner tube 45 have their lower ends closed and have the insulated vacuum chamber 43 formed as interposed therebetween.

This invention accomplishes the expected object thereof by having the tubes connected and constructed as described above and selecting materials that are proper for these tubes. Of the various kinds of tubes, the upper supporting tube 41 assumes the farthest position from the sample given for measurement and does not affect the measurement and, therefore, has the tubular body thereof formed of stainless steel, e.g. Japanese Industrial Standard SUS304, which is inexpensive and robust, similarly to the conventional main pipe.

The condensing tube 42 supported fast in the lower part of the upper supporting tube 41 and positioned in the middle part of the main pipe 23 has the tubular body thereof formed of copper. The condensing tube 42, by thus being formed of copper, is enabled to be cooled efficiently through direct thermal conduction from the bottom of the outer tube 44 which will be described herein below, maintain the temperature of 1.6 K infallibly in this region of heat exchange, and liquefy the helium 3 gas held inside at this temperature.

The outer tube 44 constituting the outer wall of the insulated vacuum chamber 43 is made of copper that shows small magnetism and excels in thermal conduction. The reason for this invention particularly using copper of excellent thermal conduction for the outer tube 44 is that the sample chamber 12 of the MPMS permitting insertion therein of the helium 3 refrigerator is enabled to cool the interior thereof till 1.6 K by inducing cold helium gas from below and consequently that the condensing tube 42 is infallibly cooled to 1.6 K by the thermal conduction from the bottom of the outer tube 44 as described above during the process for liquefying the helium 3 gas as necessitated prior to the cooling to 0.3 K by the evacuation of helium 3.

The lower inner tube 45 constituting the inner wall of the insulated vacuum chamber 43 is made of titanium in the place of s.s., which has been used conventionally. When the lower inner tube 45 constituting the main body of the main pipe 23 was formed of titanium as described, the background signal which existed in the absence of the insertion of the sample for measurement could be decreased below $10^{-4}$ emu even when a magnetic field of 1 T was applied. As a result, it has become possible to effect measurement in the magnetic field of the MPMS to the upper limit thereof infallibly except the case of using a sample of extremely low magnetism for the measurement.

As regards the main pipe 23, the upper supporting tube 41 may be formed of titanium besides the lower inner pant 45. Since a thin-wall rolled article of titanium is expensive and the upper supporting tube 41 is parted far from the sample, s.s. is useful enough in spite of slightly strong magnetism as it shows very small thermal conduction, manifests the ability to suppress the inflow of heat into the sample space, and acquires strength fully satisfactorily. When titanium is used as the material for the lower inner tube, his fact leads to extremely decreasing the hysteresis of the background against the change in the magnetic field to a practically ignorable extent. As a result, even samples of dramatically small magnitudes of magnetism can be effectively measured because the deduction of the background can be carried out without any problem.

INDUSTRIAL APPLICABILITY

This invention enables magnetization measurement to be implemented infallibly till 0.3 K by utilizing a commercially available magnetic property measurement system (MPMS) and, therefore, can be effectively utilized in the field which specializes in measuring physical properties, such as magnetizing properties of samples having small magnetism, at very low temperatures with high sensitivity.

The invention claimed is:

1. A helium 3 refrigerator-utilizing a magnetic property measurement system comprising:
   a helium 3 refrigerator provided with a sample rod having a sample fixed thereon and a main pipe having the sample rod inserted therein and forming in a circumference of the sample rod a space for effecting cooling with helium 3; and
   a magnetic property measurement system provided with a tubular body for permitting insertion of the helium 3 refrigerator therein and a cooling means disposed on an outer periphery of the tubular body and operated with helium 4 and further provided with a superconducting magnet, a magnetic field forming means, a temperature adjusting means and a magnetic field adjusting means,
   wherein the main pipe is formed, sequentially from top to bottom, of an upper supporting tube, a condensing tube, a lower inner tube and an outer tube adapted to form an insulated vacuum chamber between the outer tube and the lower inner tube that seals the vacuum chamber through forming of the outer tube,
   the upper supporting tube and the lower inner tube are connected to each other through the condensing tube,
   a connecting tube is fixed at a lower end of the condensing tube, and the outer tube and the lower inner tube are connected to each other via the connecting tube with a certain gap forming the insulated vacuum chamber,
   a part of the connecting tube is mounted on an inside of the condensing tube,
   the outer tube is located outside of the connecting tube, and the lower inner tube is located inside of the connecting tube, and
   wherein the lower inner tube is formed of titanium that decreases a background signal.

2. The helium 3 refrigerator-utilizing magnetic property measurement system according to claim 1, wherein the outer tube is formed of copper.

3. The helium 3 refrigerator-utilizing magnetic property measurement system according to claim 1 or claim 2, wherein the condensing tube is formed of copper.

4. The helium 3 refrigerator-utilizing magnetic property measurement system according to claim 1, wherein the upper supporting tube is formed of stainless steel.

5. The helium 3 refrigerator-utilizing magnetic property measurement system according to claim 2, wherein the upper supporting tube is formed of stainless steel.

6. The helium 3 refrigerator-utilizing magnetic property measurement system according to claim 3, wherein the upper supporting tube is formed of stainless steel.

* * * * *